(12) United States Patent  
Xiao et al.

(10) Patent No.: US 9,786,471 B2  
(45) Date of Patent: Oct. 10, 2017

(54) PLASMA ETCHER DESIGN WITH EFFECTIVE NO-DAMAGE IN-SITU ASH

(75) Inventors: Ying Xiao, Zhubei (TW); Chin-Hsiang Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 200 days.

(21) Appl. No.: 13/337,418

(22) Filed: Dec. 27, 2011

(65) Prior Publication Data

US 2013/0160795 A1    Jun. 27, 2013

(51) Int. Cl.
*H01J 37/32* (2006.01)
*G03F 7/42* (2006.01)
*H01L 21/311* (2006.01)

(52) U.S. Cl.
CPC .......... *H01J 37/321* (2013.01); *G03F 7/427* (2013.01); *H01J 37/32596* (2013.01); *H01J 37/32706* (2013.01); *H01J 37/32807* (2013.01); *H01J 37/32889* (2013.01); *H01J 37/32899* (2013.01); *H01L 21/31138* (2013.01)

(58) Field of Classification Search
CPC .............. H01J 37/321; H01J 37/32596; H01J 37/32706; H01J 37/32889; H01J 37/32807; H01J 37/32899; H01J 37/32091; H01L 21/31138; G03F 7/427

See application file for complete search history.

(56) References Cited

U.S. PATENT DOCUMENTS

| | | | |
|---|---|---|---|
| 6,077,384 A * | 6/2000 | Collins et al. | 156/345.29 |
| 6,447,636 B1 * | 9/2002 | Qian et al. | 156/345.48 |
| 6,527,911 B1 | 3/2003 | Yen et al. | |

(Continued)

FOREIGN PATENT DOCUMENTS

| | | |
|---|---|---|
| CN | 101099234 A | 1/2008 |
| CN | 101785088 A | 7/2010 |

(Continued)

OTHER PUBLICATIONS

Notice of Allowance in Korean Patent Application No. 10-2012-0069748 dated Dec. 4, 2013.

*Primary Examiner* — Yuechuan Yu
(74) *Attorney, Agent, or Firm* — Eschweiler & Potashnik, LLC

(57) ABSTRACT

In some embodiments, the present disclosure relates to a plasma etching system having direct and localized plasma sources in communication with a processing chamber. The direct plasma is operated to provide a direct plasma to the processing chamber for etching a semiconductor workpiece. The direct plasma has a high potential, formed by applying a large bias voltage to the workpiece. After etching is completed the bias voltage and direct plasma source are turned off. The localized plasma source is then operated to provide a low potential, localized plasma to a position within the processing chamber that is spatially separated from the workpiece. The spatial separation results in formation of a diffused plasma having a zero/low potential that is in contact with the workpiece. The zero/low potential of the diffused plasma allows for reactive ashing to be performed, while mitigating workpiece damage resulting from ion bombardment caused by positive plasma potentials.

20 Claims, 9 Drawing Sheets

(56) References Cited

U.S. PATENT DOCUMENTS

| | | | |
|---|---|---|---|
| 2004/0043612 A1* | 3/2004 | Jung | 438/689 |
| 2007/0044915 A1* | 3/2007 | Ni et al. | 156/345.42 |
| 2008/0061702 A1* | 3/2008 | Ushakov et al. | 315/111.21 |
| 2008/0075834 A1* | 3/2008 | Ramaswamy et al. | 427/8 |
| 2008/0099450 A1* | 5/2008 | Lewington et al. | 219/121.58 |
| 2009/0095714 A1* | 4/2009 | Chen | H01J 37/321 216/67 |
| 2009/0236314 A1 | 9/2009 | Chen | |
| 2010/0213162 A1* | 8/2010 | Mochiki et al. | 216/17 |
| 2011/0180388 A1* | 7/2011 | Morikawa et al. | 204/192.3 |

FOREIGN PATENT DOCUMENTS

| | | | |
|---|---|---|---|
| CN | 101999155 A | | 3/2011 |
| JP | 06177092 A | * | 6/1994 |
| JP | 07326581 A | * | 12/1995 |
| JP | 09022795 A | * | 1/1997 |
| JP | 09102471 A | * | 4/1997 |
| JP | 10261626 A | * | 9/1998 |
| JP | 11260596 A | * | 9/1999 |
| JP | 2000036489 A | * | 2/2000 |
| JP | 2003115400 A | * | 4/2003 |
| JP | 4381694 B2 | | 12/2009 |
| KR | 2003078560 A | * | 10/2003 |
| TW | 200746292 | | 12/2007 |
| TW | 200913009 A | | 3/2009 |
| TW | 200913322 A | | 3/2009 |
| WO | WO 2009020129 A1 | * | 2/2009 |

\* cited by examiner

PLASMA ETCHER DESIGN WITH EFFECTIVE NO-DAMAGE IN-SITU ASH

BACKGROUND

Integrated chips are formed by complex fabrication processes, during which a workpiece is subjected to different steps to form one or more semiconductor devices. Many of the processing steps (e.g., an implantation, etch, etc.) utilize a masking layer. The masking layer allows for selective regions of a workpiece to be processed, while other regions of the workpiece are not processed. The masking layer often comprises a light sensitive photoresist material. The photoresist material is typically spun onto a semiconductor workpiece and then patterned to mask the surface of the semiconductor workpiece during a processing step.

Once the processing step is completed, the photoresist material is removed from the semiconductor workpiece before a next processing step is performed. In modern fabrication processes, photoresist is removed from a workpiece using an ashing process. Ashing is typically performed in a plasma etcher called an asher, which generates a plasma having an ashing chemistry comprising a mixture of reactive gases that interact with the photoresist to form an ash. The ash is then removed from the surface of the workpiece.

DETAILED DESCRIPTION

Figure 1:
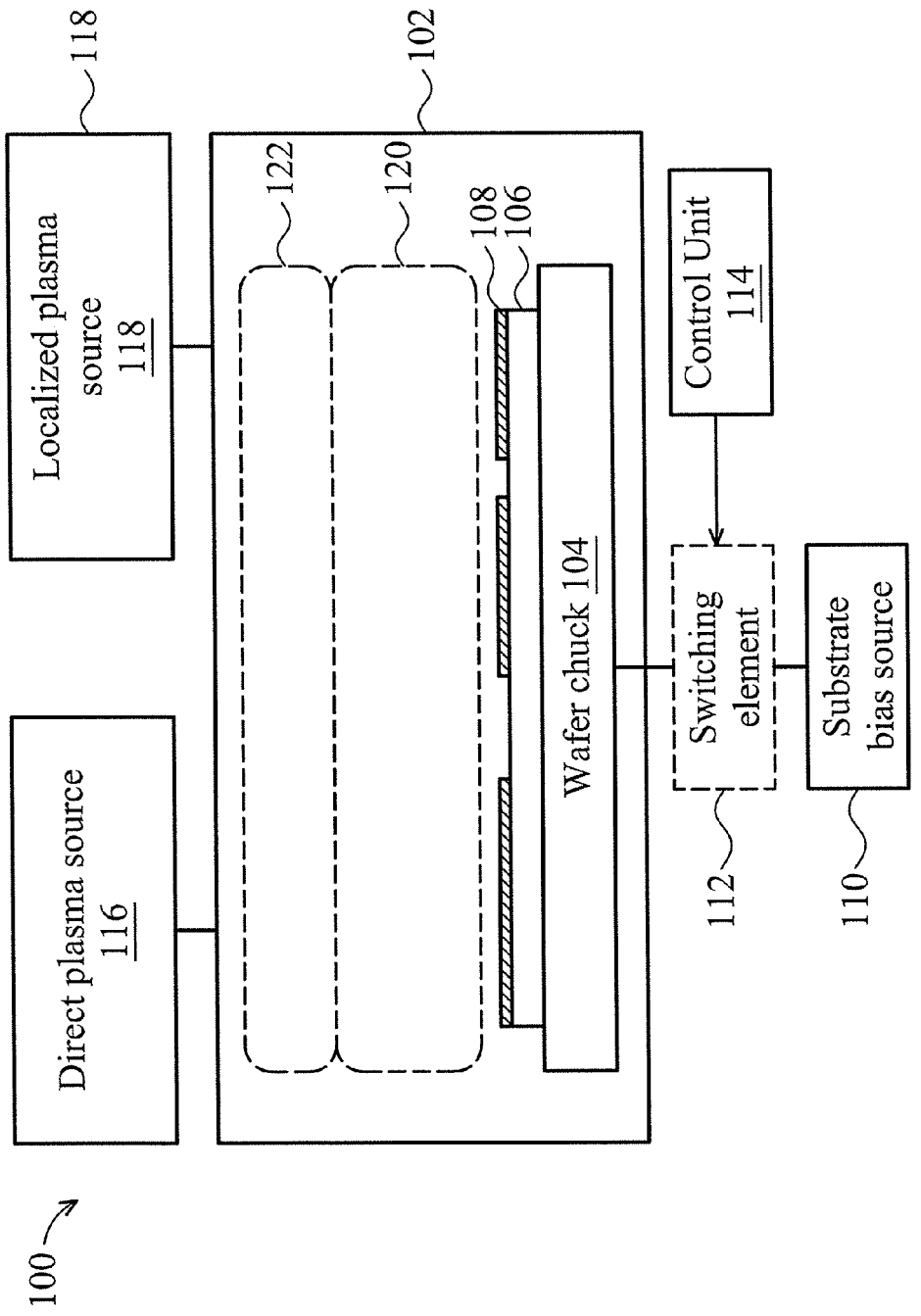
FIG. 1 illustrates a block diagram of some embodiments of a plasma etching system configured to perform in-situ ashing.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Plasma etching of a semiconductor workpiece often uses reactive gases comprising a chlorine or fluorine etching chemistry for etching silicon, dielectrics, and metals. During etching, the reactive gases are excited by a high frequency electromagnetic field resulting in an etching plasma comprising ions that bombard the surface of the semiconductor workpiece. After the plasma etching process has been completed, photoresist is removed from the workpiece using a separate ashing plasma with an ashing gas chemistry (e.g., $O_2$, $N_2$, and $H_2$). In order to prevent yield loss related to etch byproducts from interacting with moisture, in-situ ash processes may be used in advanced etching processes. However, the in-situ ash processes use a direct ashing plasma having a high potential difference between the workpiece and ashing ions. The high potential difference causes etch byproducts deposited on a processing chamber wall, such as fluorine ions, to re-dissociate and cause damage to the workpiece in during ashing.

Accordingly, the present disclosure relates to a plasma etching system configured to prevent workpiece damage during an in-situ ash process. In some embodiments, the plasma etching system comprises a direct plasma source and a localized plasma source in communication with a processing chamber. The direct plasma source is configured to provide a direct plasma to the processing chamber for etching a semiconductor workpiece. The direct plasma has a high potential, formed by applying a large bias voltage to the workpiece. After etching is completed the bias voltage and direct plasma source are turned off. The localized plasma source is then operated to provide a low potential, localized plasma to a position within the processing chamber that is spatially separated from the workpiece. The spatial separation results in formation of a diffused plasma having a zero/low potential that is in contact with the workpiece. The zero/low potential of the diffused plasma allows for reactive ashing to be performed, while mitigating workpiece damage resulting from ion bombardment caused by positive plasma potentials.

FIG. 1 illustrates a block diagram of some embodiments of a plasma etching system 100 configured to perform in-situ ashing. The plasma etching system 100 comprises a processing chamber 102 having a wafer chuck 104 configured to hold a semiconductor workpiece 106. A photoresist hard mask layer 108 is positioned on the semiconductor workpiece 106. A direct plasma source 116 and a localized plasma source 118 are in communication with the processing chamber 102.

The direct plasma source 116 is configured to provide a first plasma to a first region 120 of the processing chamber 102. The first region 120 is positioned to allow for the first plasma to be in contact with the semiconductor workpiece 106. In various embodiments, the direct plasma source 116 comprises a capacitive coupled plasma (CCP) source, an inductive coupled plasma (ICP) source, or an electron cyclotron resonance (ECR) plasma source. The localized plasma source 118 is configured to provide a localized, second plasma to a localized, second region 122 of the processing chamber 102. The second region 122 is positioned to allow for the second plasma to be spatially separated from the semiconductor workpiece 106. It will be appreciated that the sizes of the first and second regions, 120 and 122, may change during operation. For example, the first region 120 may comprise a larger region at a first time than at a later second time.

A substrate bias source 110 is electrically connected the semiconductor workpiece 106. The substrate bias source 110 is configured to selectively apply a bias voltage to the semiconductor workpiece 106. In some embodiments, a control unit 114 is configured to operate a switching element 112 to selectively connect and disconnect the substrate bias source 110 and the semiconductor workpiece 106 during plasma generation by the direct and/or localized plasma sources, 116 and 118. The bias voltage causes a potential difference to form between the semiconductor workpiece 106 and charged ions in a plasma. The potential difference accelerates the charged ions from the plasma towards the semiconductor workpiece 106 to improve etching.

During operation, the processing chamber 102 is held at a low pressure vacuum in the range of about 10 mTorr to about 100 mTorr, for example. One or more reactive gases, which enable the formation of a plasma, are provided to the processing chamber 102. In some embodiments, the reactive gases are provided from the direct plasma source 116 and/or from the localized plasma source 118.

The direct plasma source 116 is configured to provide a direct plasma (i.e., a plasma that is directly exposed to the semiconductor workpiece 106) with a high potential within the first region 120 of the processing chamber 102 for etching. In various embodiments, the direct plasma comprises an etching gas chemistry comprising etching gases such as oxygen ($O_2$), nitrogen ($N_2$), fluorine ($F_2$), etc., which enable the formation of high energy ions to etch unmasked areas of the semiconductor workpiece 106. The high potential of the direct plasma is achieved by operating the substrate bias source 110 to apply a large bias voltage to the workpiece 106, causing a high potential difference between ions within the direct plasma and the semiconductor workpiece 106. After etching is completed, the direct plasma source 116 and the bias voltage provided by the substrate bias source 110 are turned off (i.e., are turned to substantially zero powers).

The localized plasma source 118 is configured to provide a localized plasma with a low potential within the second region 122 for ashing. In various embodiments, the localized plasma comprises an ashing gas chemistry comprising ashing gases such as oxygen ($O_2$), nitrogen ($N_2$), hydrogen ($H_2$), etc., which enable ashing of the photoresist hard mask layer 108 on the semiconductor workpiece 106. In some embodiments, the localized plasma is formed in-situ, or in other words the localized plasma is formed within the processing chamber 102 after the direct plasma is formed, without interruption.

Spatial separation between the semiconductor workpiece 106 and localized plasma within the second region 122 results in the formation of a diffused plasma within the first region 120, which separates the localized plasma and the semiconductor workpiece 106. Since the substrate bias source 110 is substantially zero, the diffused plasma has a substantially zero potential. Ashing gas ions (e.g., $O_2$) from the localized plasma are diffused through the diffused plasma and become neutral radicals that diffuse into the photoresist hard mask layer 108 at low energies that do not damage the semiconductor workpiece 106. The diffused ashing gas ions interact with the photoresist hard mask layer 108 forming an ash that can be removed from the processing chamber 102.

Figure 2:
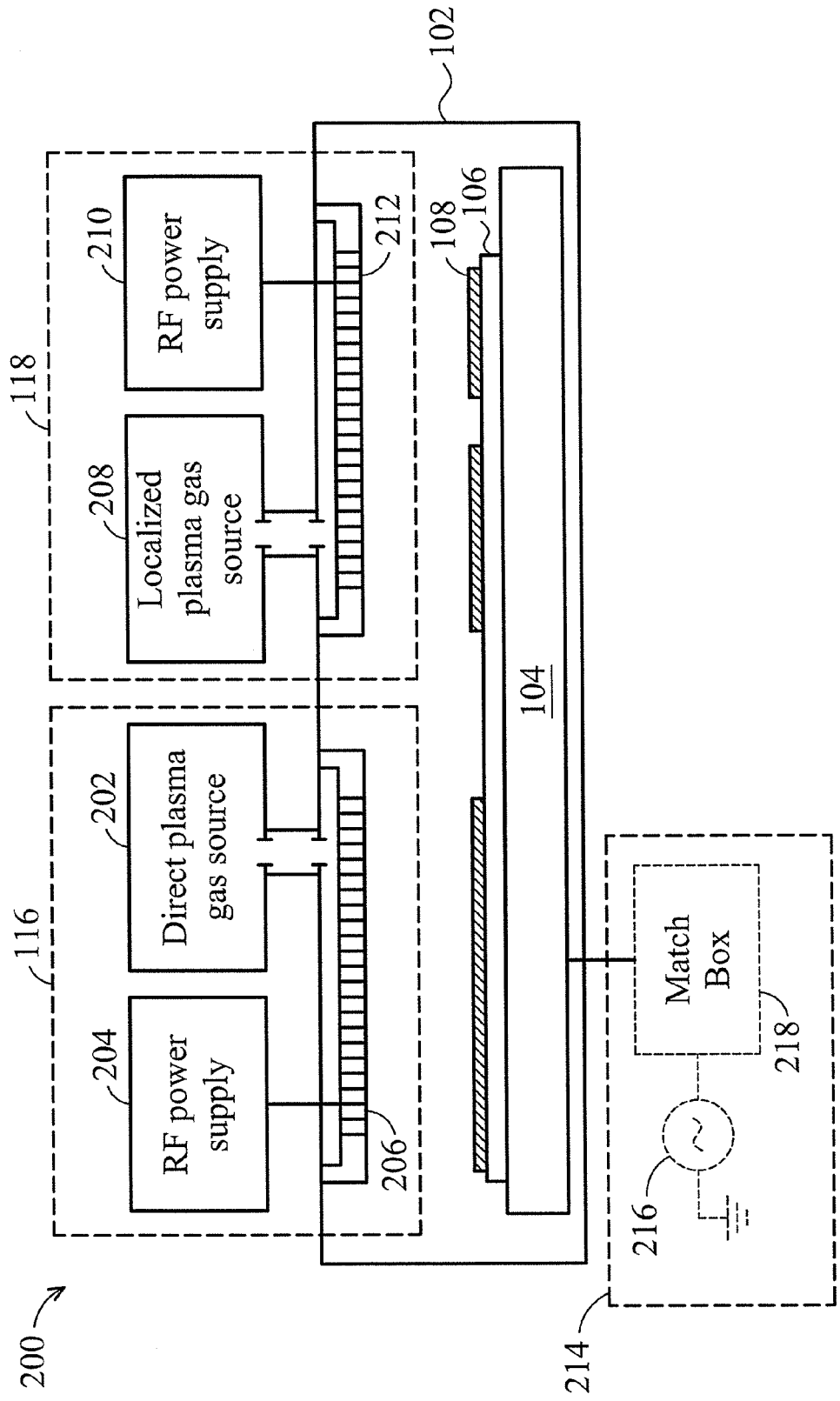
FIG. 2 illustrates a block diagram of some embodiments of a plasma etching system comprising inductively coupled direct and localized plasma sources.
Figure 3:
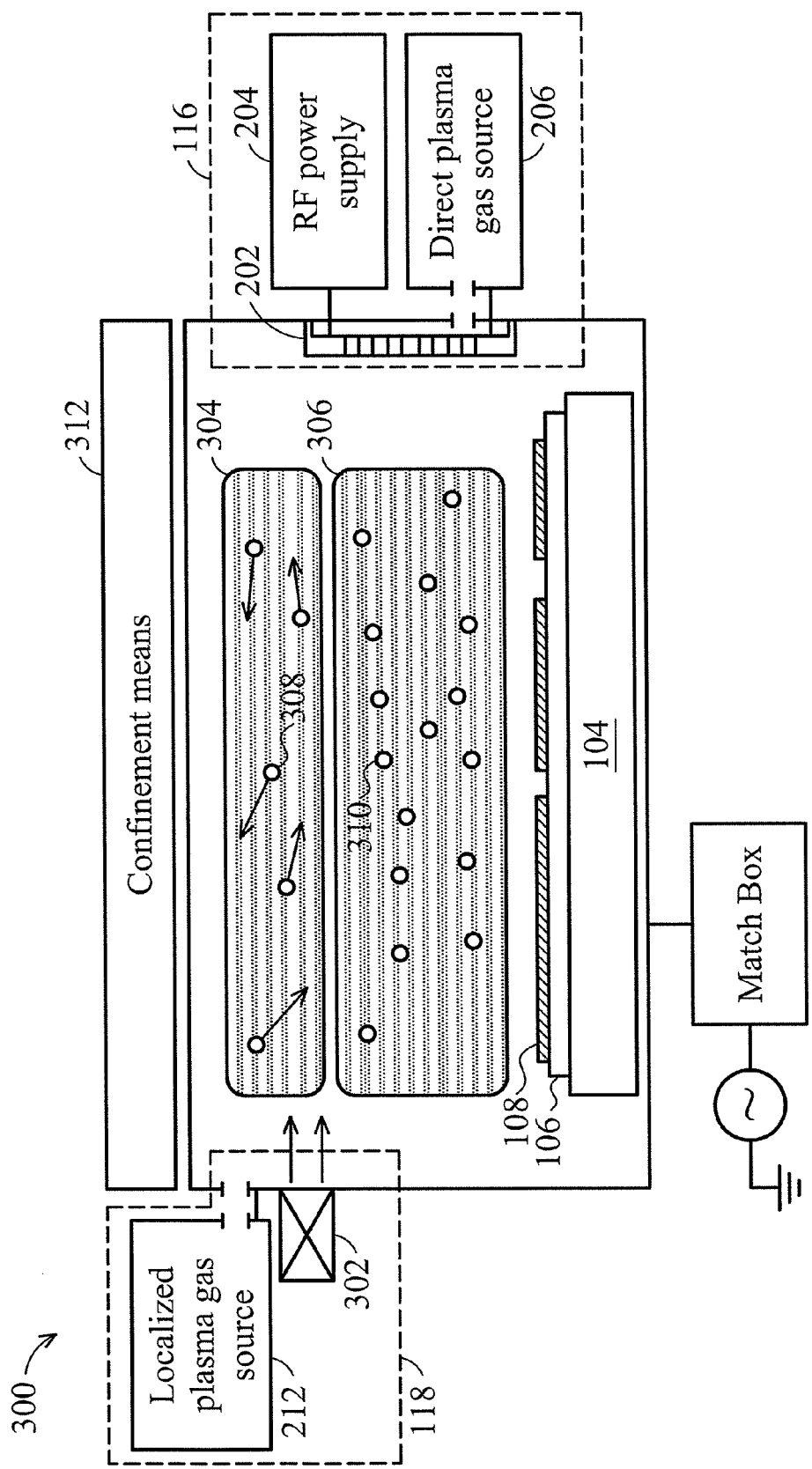
FIG. 3 illustrates a block diagram of some alternative embodiments of a plasma etching system having a localized plasma source comprising a hollow cathode.
Figure 4:
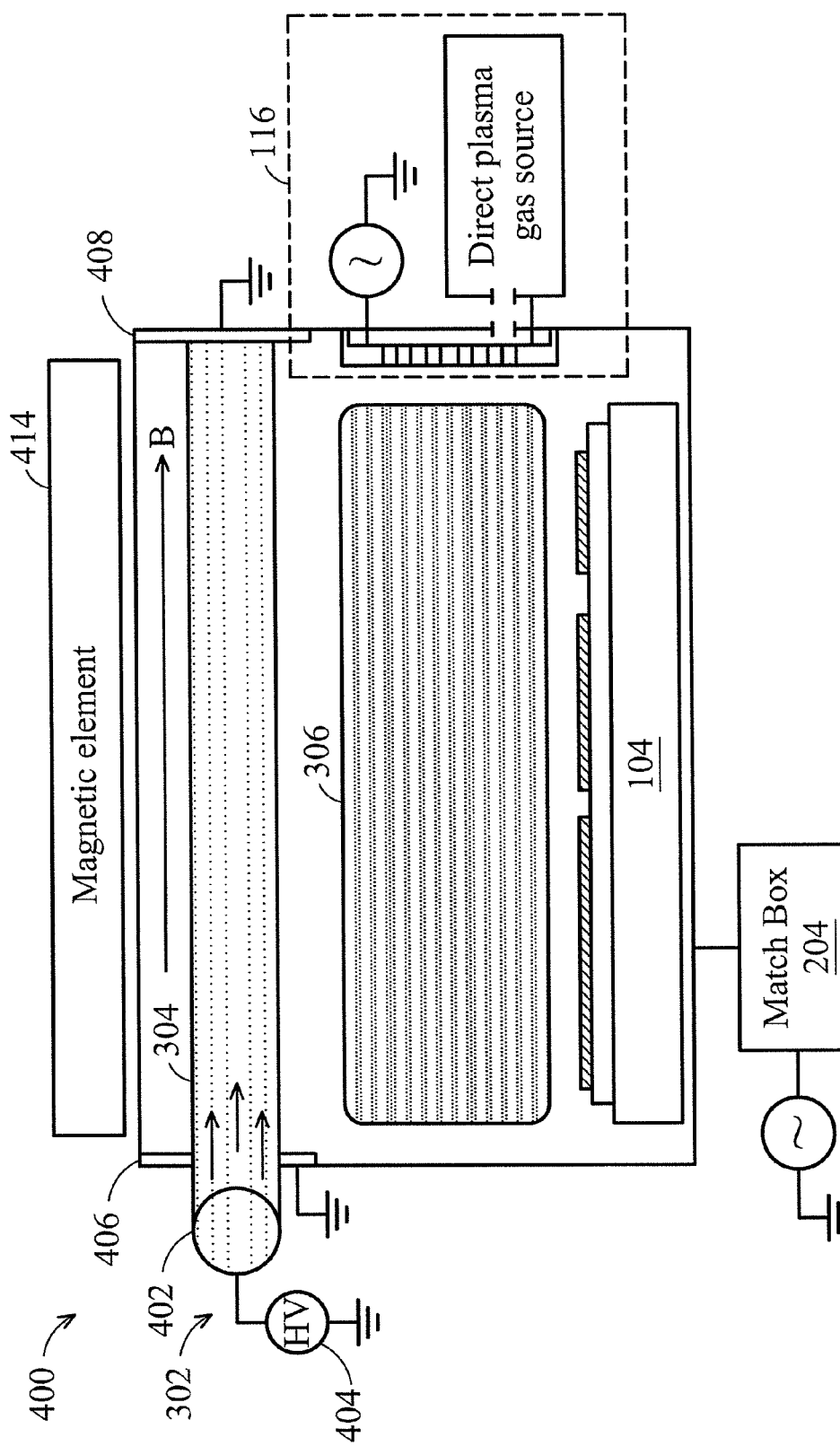
FIG. 4 illustrates a more detailed block diagram of some embodiments of a localized plasma source comprising a hollow cathode.

It will be appreciated that the direct, diffused, and localized plasmas can be generated by various means. FIGS. 2-4 illustrate block diagrams of various non-limiting embodiments of plasma etching systems having a direct plasma source and a localized plasma source as provided herein.

FIG. 2 illustrates a block diagram of some embodiments of a plasma etching system 200 comprising a direct plasma source 116 and a localized plasma source 118 comprising inductively coupled plasma sources.

The direct plasma source 116 comprises a direct plasma gas source 202, a first RF power supply 204, and a first antenna 206. The direct plasma gas source 202 is in communication with the processing chamber 102 by way of a direct plasma gas conduit and is configured to provide one or more etchant gases to the processing chamber 102. The etchant gases provided to the processing chamber 102 may vary depending on the material to be etched. In some embodiments, wherein the material to be etched comprises an oxide material, the etchant gases may comprise a mixture of one or more etching gas chemistries comprising $O_2$ or/and $H_2$, for example.

The first RF power supply 204 is connected to the first antenna 206. The first RF power supply 204 is configured to generate an RF signal operating at a set frequency (e.g., 13.56 MHz). The RF signal is provided to the first antenna 206, which provides inductively coupled energy from the RF signal to etchant gas particles within the processing chamber 102. When sufficient power has been delivered to the etchant gas particles a direct plasma is ignited.

The localized plasma source 118 comprises a localized plasma gas source 208, a second RF power supply 210, and a second antenna 212. The localized plasma gas source 208 is in communication with the processing chamber 102 by way of a localized plasma gas conduit and is configured to provide one or more ashing gases to the processing chamber 102. In some embodiments, the ashing gases comprise ashing gas chemistries that perform ashing of photoresist material, such as $O_2$, $H_2$ or/and $N_2$, for example.

The second RF power supply 210 is connected to the second antenna 212. The second RF power supply 210 is configured to generate an RF signal operating at a set frequency (e.g., 13.56 MHz). The RF signal is provided to the second antenna 212, which provides inductively coupled energy from the RF signal to ashing gas particles within the processing chamber 102. When sufficient power has been delivered to the ashing gas particles a localized plasma is ignited.

A third RF power supply 214 is configured to selectively apply a bias voltage the semiconductor workpiece 106. In some embodiments, the third RF power supply 214 is configured to operate independent of the second RF power supply 210.

In some embodiments, because RF power supplies 204, 210, and 214 operate at output powers having an output impedance (e.g., 50 ohms) that rarely matches the plasma load within the processing chamber 102, matching networks are configured to match the output impedance of an RF power supply to a complex impedance established by an antenna and/or plasma load (i.e., impedance), thereby efficiently coupling power from an RF power supply into a plasma. For example, FIG. 2 illustrates the third RF power supply 214 as comprising a matching network 218 configured to match the output impedance of a power source 216 to a complex impedance established by the workpiece 106 and a plasma load.

In some embodiments, the first RF power supply 204 is configured to provide an RF signal having a power in a range of about 100 W to about 200 W or in a range of about 1000 W to about 2500 W. In some embodiments, the second RF power supply 210 is configured to provide an RF signal having a power in a range of about 50 W to about 200 W. In some embodiments, the third RF power supply 214 is configured to provide a bias signal in a range of about 0 V to about 200 V.

It will be appreciated that the position of the first and second antennas, 206 and 212, shown in FIG. 2 is a non-limiting embodiment and that the positions may vary in different embodiments. In some embodiments, the first and second antennas, 206 and 212, are configured at positions which enable the formation of plasmas within a particular location with the processing chamber 102. For example, in some embodiments the first antenna 206 is located at a position closer to the semiconductor workpiece 106 than the second antenna 212. Such an antenna configuration allows for the first antenna 206 to generate a direct plasma in contact with the semiconductor workpiece 106 and the second antenna 212 to generate a localized plasma, which is separated from a workpiece during in-situ ashing by a diffused plasma.

FIG. 3 illustrates an alternative embodiment of a plasma etching system 300. The plasma etching system 300 comprises a direct plasma source 116 comprising an inductively coupled plasma source and a localized plasma source 118 comprising a hollow cathode 302.

As shown in FIG. 3, the hollow cathode 302 is integrated into a processing chamber 102 of the plasma etching system 300 at a position that separates the localized plasma generation from the semiconductor workpiece 106. The hollow cathode 302 is configured to output a localized plasma 304, having an ashing gas chemistry (e.g., $O_2$, $H_2$, or $N_2$) from the hollow cathode 302 into the processing chamber 102. Once the localized plasma 304 is in the processing chamber 102, a confinement means 312 is configured to operate upon the localized plasma 304 to confine it to a region within the processing chamber 102. In various embodiments, the confinement means 312 may comprise an electrostatic plasma confinement means and/or a magnetic plasma confinement means, for example.

By separating the localized plasma generation from the semiconductor workpiece 106, a diffused plasma 306 is formed having a low potential between the localized plasma and the semiconductor workpiece 106. The diffused plasma 306, allows for reactive ashing gas ions within the localized to be diffused into the photoresist hard mask layer 108 as neutral radicals that react with the photoresist hard mask layer 108 to form an ash. For example, as shown in FIG. 3, ions in the localized plasma 308 have a higher potential (illustrated by arrows) than ions/neutral radicals in the diffused plasma 310. The relatively low potential of the ions/neutral radicals within the diffused plasma 310 reduces the energy at which the localized plasma ions 308 are incident on the semiconductor workpiece 106 to prevent damage to the semiconductor workpiece 106 during ashing.

FIG. 4 illustrates a block diagram of some embodiments of a plasma etching system 400 having a more detailed illustration of a localized plasma source comprising a hollow cathode 302 configured to generate an electron beam-generated plasma within a processing chamber 102.

In some embodiments, the hollow cathode 302 comprises a hollow conductive cathode tube 402 coupled to a high voltage DC power supply 404 configured to provide a high voltage to the hollow conductive cathode tube 402. It will be appreciated that in other embodiments, the hollow cathode 302 may comprise a hollow conductive cathode having a shape that is non-tubular. A slotted anode 406 and a termination anode 408 are located downstream of the hollow conductive cathode tube 402. In some embodiments, the slotted anode 406 and a termination anode 408 are located within the processing chamber 102. Both the slotted anode 406 and the termination anode 408 are held at ground.

The large potential difference between the hollow conductive cathode tube 402 and the anodes, 406 and 408, generates an electric field that pulls electrons from the hollow cathode 302 toward the anodes, 406 and 408. The electrons are discharged into the chamber as an electron beam. In some embodiments, one or more magnetic elements 414 are configured to provide a magnetic field B parallel to the electron beam. The magnetic field magnetically collimates the beam of high energy electrons. The electrons collide with one or more ashing gases, causing the ashing gases to ionize and form a plasma sheet comprising the localized plasma.

In some embodiments, the one or more magnetic elements 414 are further configured to confine the localized plasma 304 within a second region of the processing chamber 102. In some embodiments, the one or more magnetic elements 414 comprises one or more bar magnets configured to generate a magnetic field within the processing chamber 102. In various embodiments, the one or more magnetic elements 414 may be located internal to and/or external to the processing chamber 102. Although, FIG. 4 illustrates magnetic elements as being positioned above the localized plasma 304, it will be appreciated the magnetic elements may be positioned along more than one side of the localized plasma. For example, magnetic elements 414 can be positioned both above and below the localized plasma 304.

Figure 5:
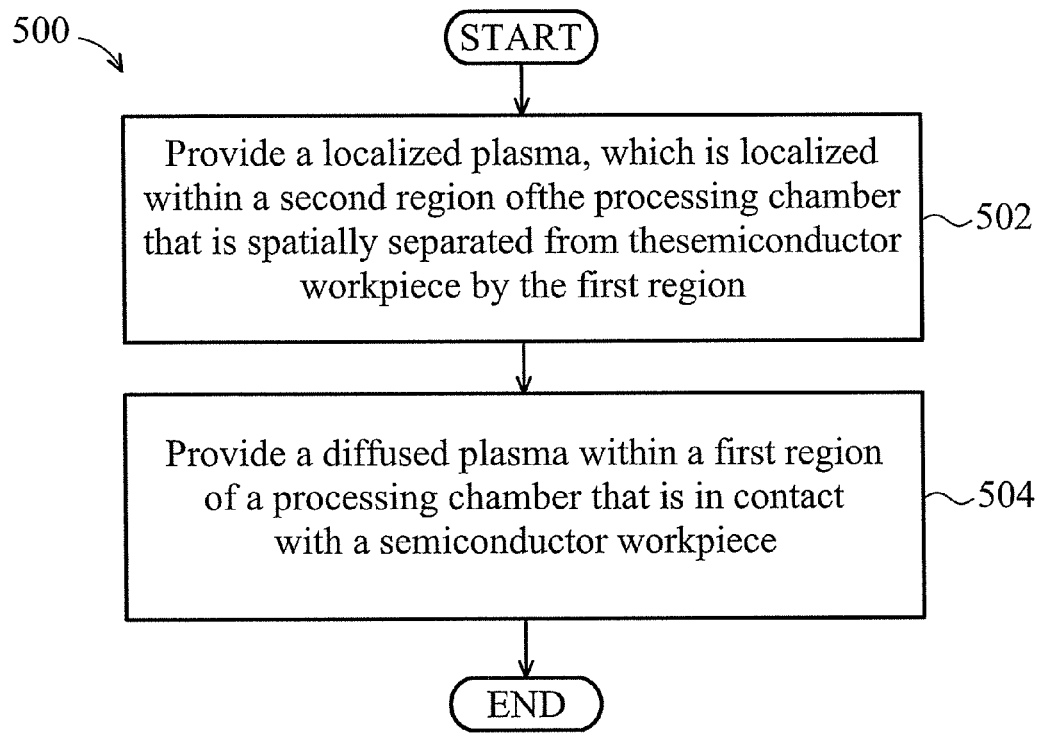
FIG. 5 illustrates a flow diagram of some embodiments of a method for performing an in-situ ashing of photoresist material on a workpiece without damaging the workpiece.

FIG. 5 illustrates a flow diagram of some embodiments of a method 500 for performing an in-situ ashing of photoresist material on a workpiece, without damaging the workpiece. While methods disclosed herein (e.g., methods 500 and 600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502 a localized plasma is provided to a localized second region of the processing chamber that is spatially separated from the semiconductor workpiece by a first region.

At 504 a diffused plasma is provided to the first region of a processing chamber. The first region of the processing chamber is in contact with a semiconductor workpiece. The diffused plasma has a lower potential than the localized plasma, so that by separating the localized plasma and the semiconductor workpiece by a lower potential diffused plasma, damage to the semiconductor workpiece due to the ions within the localized plasma is mitigated.

Figure 6:
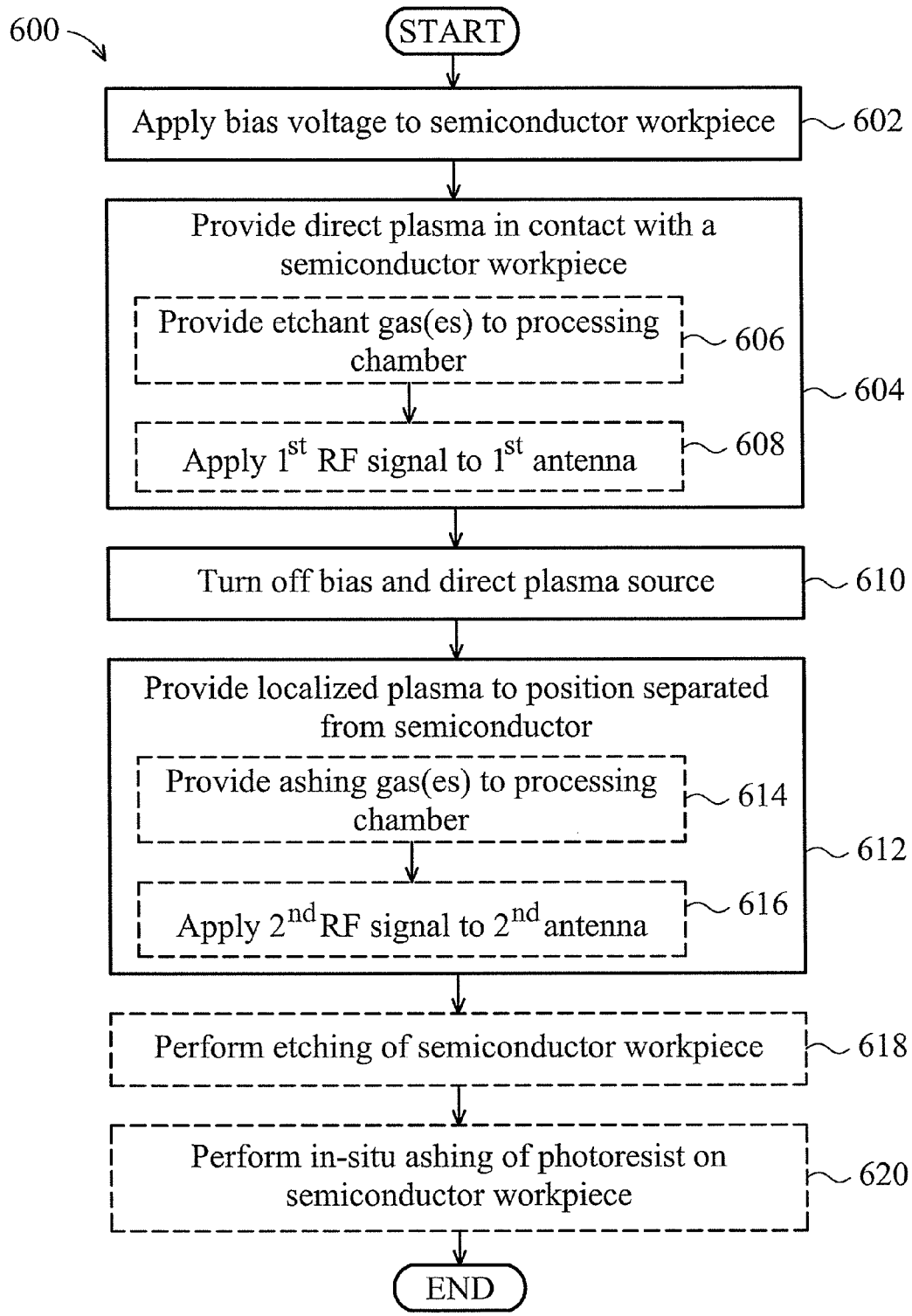
FIG. 6 illustrates a flow diagram of some embodiments of an alternative method for performing an in-situ ashing of photoresist material on a workpiece without damaging the workpiece.

FIG. 6 illustrates a flow diagram of some embodiments of a method 600 for performing an in-situ ashing of photoresist material on a workpiece, without damaging the workpiece.

At step 602 a bias voltage is applied to a semiconductor workpiece within a processing chamber. In some embodiments the bias voltage is in the range of about 50V to about 500V, for example At step 604 a direct plasma is provided to the processing chamber. The direct plasma is provided to a position within a processing chamber so that the direct plasma or a product thereof is in contact with a semiconductor workpiece. In various embodiments, the direct plasma is generated by a capacitive coupled plasma source, by an inductive coupled plasma source, or by a cyclotron resonance plasma source.

In some embodiments, the direct plasma is generated by first providing one or more etchant gases to the processing chamber at step 606. At 608 a first RF signal is applied to a first antenna configured to inductively couple power from the first RF signal to the etchant gases. The power of the first RF signal varies depending upon the etching application. For example, the first RF signal may have an RF power in the range of about 100 W to about 200 W for front end etching applications or in the range of about 1000 W to about 2000 W for back end etching applications. Once sufficient energy has been provided to the etchant gases a direct plasma, comprising a plurality of ions having a high potential difference with the semiconductor workpiece, is ignited.

At step 610 the bias voltage and direct plasma source are turned off. In some embodiments, turning off the bias voltage and direct plasma source may comprise turning a bias voltage and an RF power supply to a substantially zero value that dissipates the high potential direct plasma.

At step 612 a localized plasma is provided to a position within a processing chamber separated from the workpiece. In various embodiments, the localized plasma is generated by a hollow cathode, by a capacitive coupled plasma source, by an inductive coupled plasma source, or by a cyclotron resonance plasma source. In some embodiments, the localized plasma is generated by first providing one or more ashing gases to the processing chamber at step 614. At step 616 a second RF signal is applied to a second antenna configured to inductively couple power from the second RF signal to the ashing gases. In some embodiments, the power of the second RF signal is in a range of about 100 W to about 200 W.

The spatial separation of the localized plasma and the workpiece, results in the formation of a diffused plasma having a zero/low potential located between the localized plasma and the workpiece. The low-zero potential of the diffused plasma causes ions from the localized plasma to become incident to the workpiece as low energy neutral radicals.

In some embodiments, the localized plasma is utilized to perform etching of a workpiece at step 616. Due to placement of the diffused plasma between the localized plasma and the semiconductor workpiece, the resulting low energy of neutral radicals can perform some delicate etching without silicon loss. For example, the localized plasma may be used for front end of the line transistor device gate structure etching.

In some embodiments, the localized plasma is utilized to perform in-situ ashing of photoresist at step 618. Typically, during an ash process reactive ashing gases, such as $O_2$, bombard the workpiece. However, the diffused plasma provides a buffer that causes the reactive ashing gases to diffuse into the workpiece. The diffused reactive ashing gases do not cause damage to the workpiece.

Figure 7:
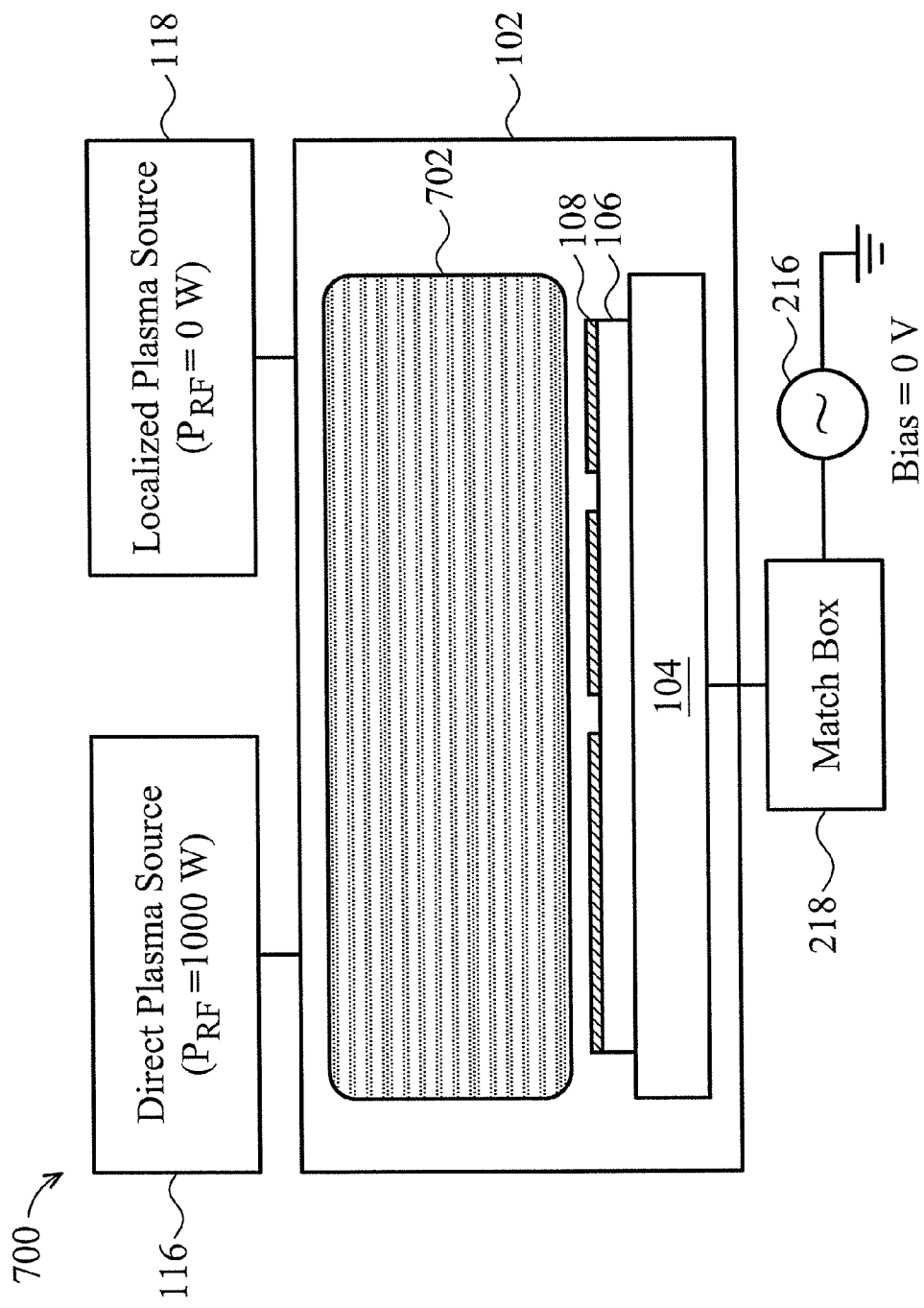
FIGS. 7-9 are block diagrams of a processing chamber operated according to the method of FIG. 6.
Figure 8:
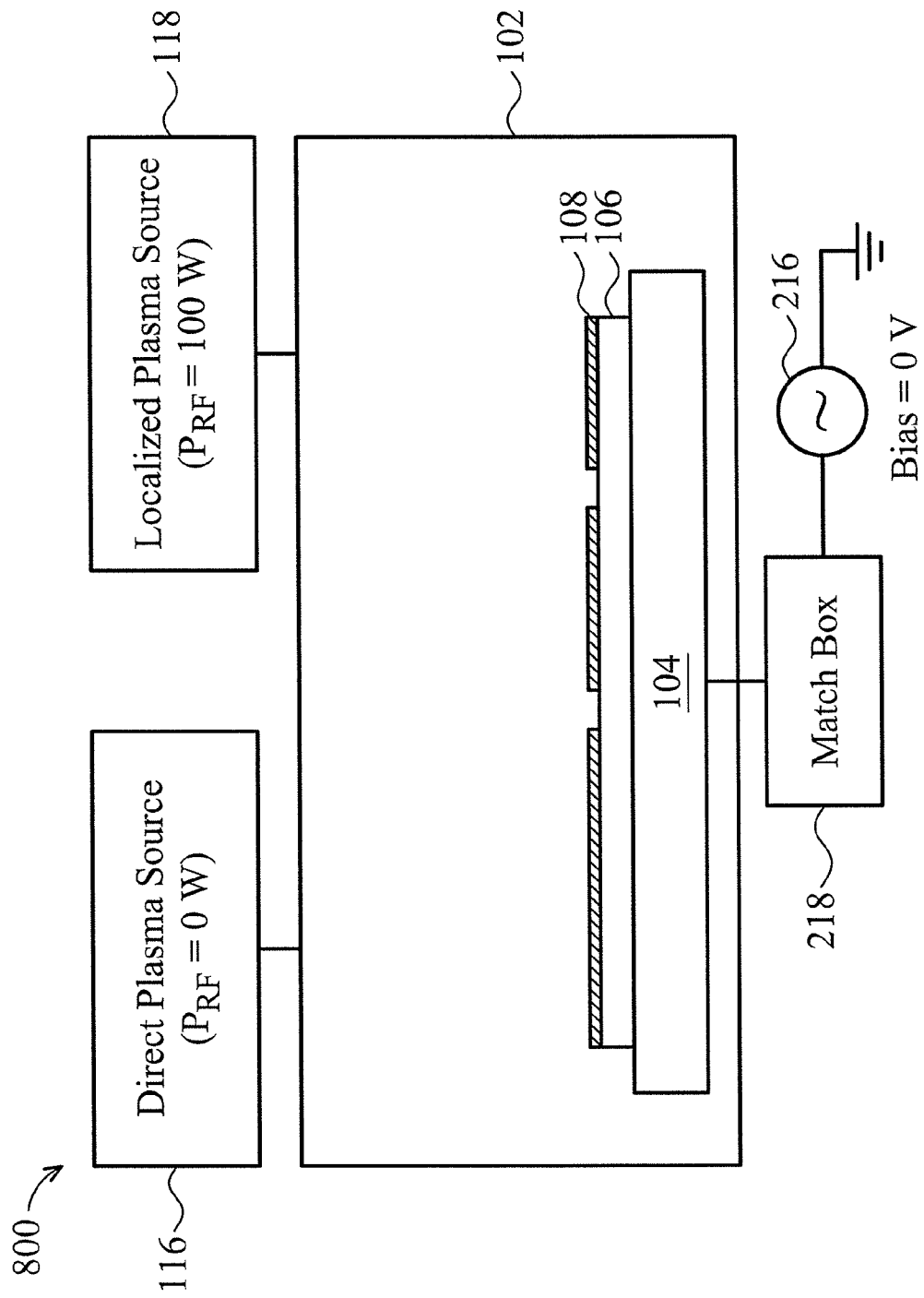
Figure 9:
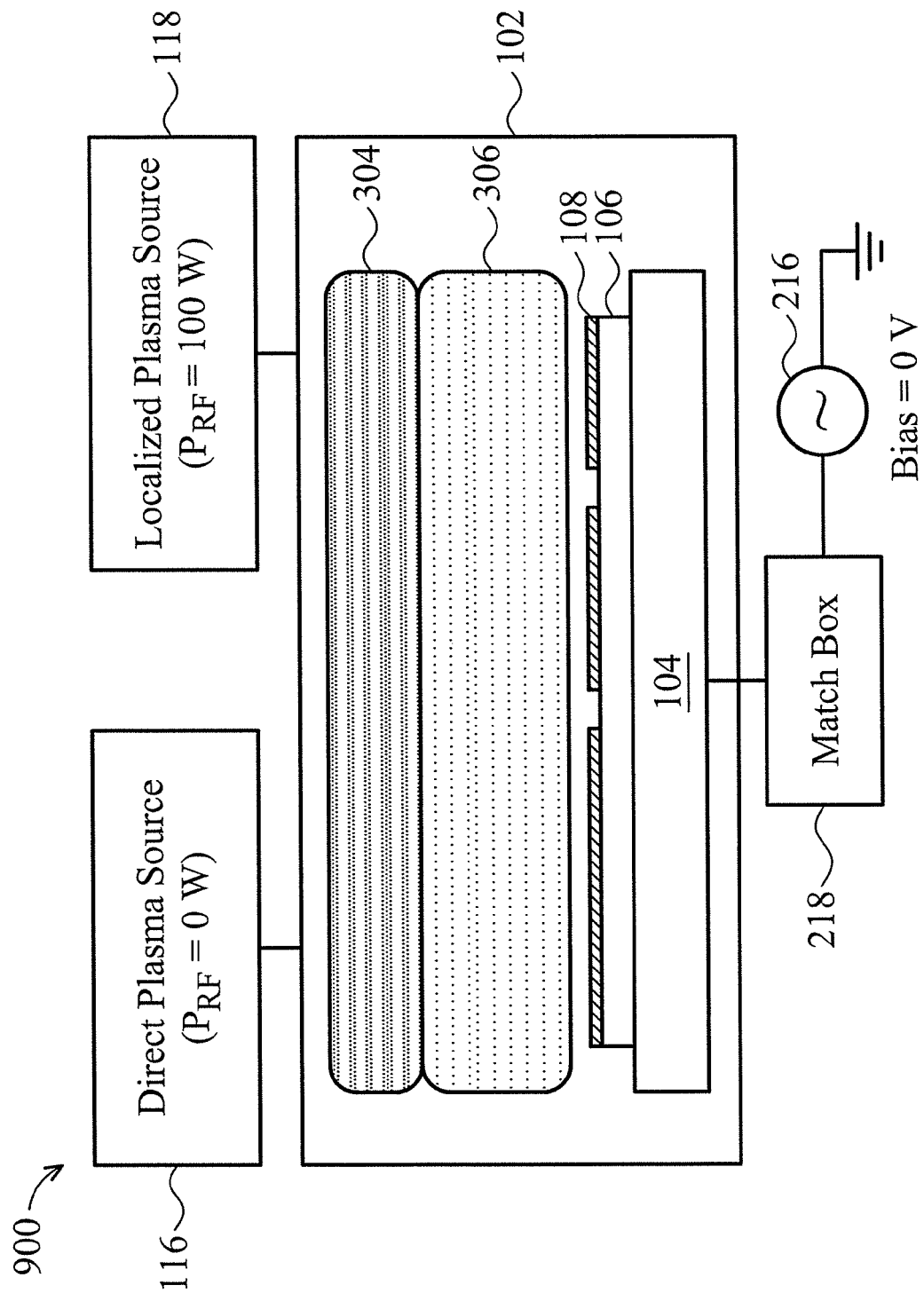

FIGS. 7-9 are block diagrams views of a processing chamber operated according to an exemplary application of the method of FIG. 6. The values used in FIGS. 7-9 are non-limiting examples only intended to illustrate a potential application of method 600 to a plasma etching system.

FIG. 7 illustrates a block diagram of a plasma etching system 800 having a direct plasma 702 within a processing chamber 102. The direct plasma 702 is provided by operating the direct plasma source 116 with an RF power of 1000 W. The position of the direct plasma 702 within the processing chamber 102 allows for the direct plasma 702 to be in contact with the semiconductor workpiece 106. A power source 216 is configured to apply a bias voltage of 100 V to the workpiece 106 to provide a high potential difference between ions of the direct plasma 702 and the semiconductor workpiece 106. The ions, having a high potential, are configured to etch unmasked areas of the semiconductor workpiece 106.

FIG. 8 illustrates a block diagram of a plasma etching system 800 with the voltage bias and direct plasma source turned off. By turning off the RF power of the direct plasma source 116 and the bias voltage of the power source 216 (i.e., by operating with a RF power of 0 W and a bias voltage at 0 V), the direct plasma is dissipated.

FIG. 9 illustrates a block diagram of a plasma etching system 900 having a localized plasma 304 within a processing chamber 102. The localized plasma 304 is provided by operating the localized plasma source 118 with an RF power of 100 W. The localized plasma 304 is separated from the semiconductor workpiece 106, causing a diffused plasma 306 to be formed. The diffused plasma 306 prevents the low potential ashing gas ions of the localized plasma 304 from bombarding the semiconductor workpiece 106. Instead, the low/zero potential of the diffused plasma 306 causes the ashing gas ions of the localized plasma 304 to be diffused into the photoresist hard mask layer 108, where the ashing gases react to form an ash.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein Therefore, the present disclosure relates to a plasma etcher that performs in-situ ashing with effectively no damage to an etched workpiece.

In some embodiments, the present disclosure relates to a plasma etching system, comprising a processing chamber configured to house a semiconductor workpiece. A first plasma source is configured to provide a first plasma within a first region of the processing chamber, wherein the first region is in contact with the semiconductor workpiece. A second plasma source is configured to provide a second plasma in-situ with the first plasma, which is localized within a second region of the processing chamber that is spatially separated from the semiconductor workpiece by the first region. A substrate bias source is configured to selectively apply a bias voltage to the semiconductor workpiece.

In another embodiment, the present disclosure relates to a plasma etching system for in-situ etching and photoresist ashing. The plasma etching system comprises a processing chamber configured to house a semiconductor workpiece having a photoresist material. A localized plasma source is configured to provide a localized plasma having a low potential to a position within the processing chamber that is spatially separated from the semiconductor workpiece. The spatial separation causes formation of a diffused plasma having a substantially zero potential to a position within the processing chamber between the localized plasma and the semiconductor workpiece. Ashing gas ions from the localized plasma diffuse through the diffused plasma to the photoresist material to enable ashing of the photoresist material without damage to the semiconductor workpiece.

In another embodiment, the present disclosure relates to a method of in-situ photoresist ashing. The method comprises providing a localized plasma to a position a second region of the processing chamber that is spatially separated from a semiconductor workpiece by a first region, wherein the localized plasma has a plurality of ashing gas ions. The method further comprises providing a diffused plasma within the first region of a processing chamber that is in contact with the semiconductor workpiece. The ashing gas ions from the localized plasma diffuse through the diffused plasma and become neutral radicals that diffuse into a photoresist material on the semiconductor workpiece at low energies that do not damage the semiconductor workpiece.

What is claimed is:

1. A plasma etching system, comprising
a processing chamber configured to house a semiconductor workpiece;
a first plasma source comprising a first RF antenna coupled to a first RF power supply and configured to generate an etching plasma, that extends from an intermediate height of the processing chamber vertically down to an upper surface of the semiconductor workpiece, by exciting a first etching gas chemistry using a first RF signal having a first frequency, wherein the etching plasma is in direct contact with the semiconductor workpiece and wherein the etching plasma is configured to etch the semiconductor workpiece and to leave byproducts of the first etching gas chemistry within the processing chamber;
a second plasma source comprising a second RF antenna coupled to a second RF power supply and configured to generate an ashing plasma, having ashing gas ions in-situ with the etching plasma, by exciting an ashing gas chemistry using a second RF signal, wherein the ashing plasma overlies and is vertically spatially separated from the upper surface of the semiconductor workpiece by the etching plasma;
a substrate bias source configured to selectively apply a bias voltage to the semiconductor workpiece;
wherein the etching plasma and the ashing plasma are formed within a contiguous space of the processing chamber that is defined by sidewalls and top and bottom surfaces of the processing chamber, and that continuously extends along the sidewalls between the top and bottom surfaces of the processing chamber; and
a control unit configured to selectively operate a switching element to apply the bias voltage from the substrate bias source to the semiconductor workpiece when the first RF power supply is operated to generate the etching plasma, and further configured to operate the switching element to disconnect the bias voltage from the semiconductor workpiece when the first RF power supply is turned off and the second RF power supply is operated to generate the ashing plasma.

2. The system of claim 1, further comprising:
a first plasma gas source in communication with the processing chamber by way of a first gas conduit and configured to provide the first etching gas chemistry used to generate the etching plasma; and
a second plasma gas source different than the first plasma gas source and in communication with the processing chamber by way of a second gas conduit different than the first gas conduit, wherein the second plasma gas source is configured to provide the ashing gas chemistry used to generate the ashing plasma.

3. The system of claim 2,
wherein the first gas conduit is in closer proximity to the first RF antenna than to the second RF antenna; and
wherein the second gas conduit is in closer proximity to the second RF antenna than to the first RF antenna.

4. The system of claim 1,
wherein the first RF power supply is configured to provide a first RF power that is in a first range of between approximately 1000 watts (W) and approximately 2000 W; and
wherein the second RF power supply is configured to provide a second RF power that is in a second range of between approximately 50 W and approximately 200 W.

5. The system of claim 1, wherein the first RF antenna and the second RF antenna are disposed within the processing chamber.

6. The system of claim 1,
wherein the first plasma source comprises a capacitive coupled plasma (CCP) source.

7. The system of claim 1, further comprising: wherein first etching gas chemistry comprises fluorine; and wherein the ashing gas chemistry comprises oxygen, nitrogen, or hydrogen.

8. The system of claim 7, wherein the etching plasma is configured to generate flourine byproducts on a sidewall of the processing chamber during etching of the semiconductor workpiece.

9. The system of claim 8, wherein the ashing gas ions are configured to diffuse into a photoresist layer overlying the upper surface of the semiconductor workpiece to form an ash.

10. The system of claim 1, wherein the first plasma source comprises an inductive coupled plasma (ICP) source.

11. The system of claim 1, wherein the first plasma source comprises an electron cyclotron resonance (ECR) plasma source.

12. A plasma etching system, comprising
a processing chamber configured to house a semiconductor workpiece having a photoresist layer;
a first plasma source comprising a first power supply and configured to generate an etching plasma that extends from an intermediate height of the processing chamber vertically down to an upper surface of the semiconductor workpiece, wherein etching plasma is in direct contact with the semiconductor workpiece and wherein the etching plasma is configured to etch the semiconductor workpiece;
a second plasma source comprising a second power supply and configured to generate an ashing plasma in-situ with the etching plasma, which overlies and is vertically spatially separated from the upper surface of the semiconductor workpiece by the etching plasma, wherein the etching plasma and the ashing plasma are formed within a contiguous space of the processing chamber that is defined by sidewalls and top and bottom surfaces of the processing chamber, and that continuously extends along the sidewalls between the top and bottom surfaces of the processing chamber;
a substrate bias source configured to selectively apply a bias voltage to the semiconductor workpiece; and
a control unit configured to selectively operate a switching element to apply the bias voltage from the substrate bias source to the semiconductor workpiece when the first power supply is operated to generate the etching plasma, and further configured to operate the switching element to disconnect the bias voltage from the semiconductor workpiece when the first power supply is turned off and the second power supply is operated to generate the ashing plasma.

13. The system of claim 12, further comprising:
a first plasma gas source in communication with the processing chamber by way of a first gas conduit and configured to provide a first etching gas chemistry used to generate the etching plasma; and
a second plasma gas source different than the first plasma gas source and in communication with the processing chamber by way of a second gas conduit different than the first gas conduit, wherein the second plasma gas source is configured to provide an ashing gas chemistry used to generate the ashing plasma.

14. The system of claim 12,
wherein the first power supply is coupled to a first RF antenna; and
wherein the second power supply, which is different than the first power supply, is coupled to a second RF antenna.

15. The system of claim 14,
wherein the first power supply is configured to provide a first RF signal having a first power; and
wherein the second power supply is configured to provide a second RF signal having a second power that is less than the first power.

16. The system of claim 14,
wherein the first gas conduit is in closer proximity to the first RF antenna than to the second RF antenna; and
wherein the second gas conduit is in closer proximity to the second RF antenna than to the first RF antenna.

17. A plasma etching system, comprising a processing chamber configured to house a semiconductor workpiece; a first plasma source comprising a first antenna coupled to a first RF power source and configured to generate an etching plasma that extends from an intermediate height of the processing chamber vertically down to an upper surface of the semiconductor workpiece, wherein the etching plasma is configured to etch the semiconductor workpiece; a second plasma source comprising a second antenna coupled to a second power RF source, different than the first RF power source, and configured to generate an ashing plasma that overlies and is vertically separated from the upper surface of the semiconductor workpiece by the etching plasma; wherein the ashing plasma comprises ashing gas ions configured to diffuse into a photoresist layer overlying the semiconductor workpiece to form an ash; a first plasma gas source in communication with the processing chamber by way of a first gas conduit and configured to provide a first etching gas chemistry used to generate the etching plasma; a second plasma gas source different than the first plasma gas source and in communication with the processing chamber by way of a second gas conduit different than the first gas conduit, wherein the second plasma gas source is configured to provide an ashing gas chemistry used to generate the ashing plasma; wherein the etching plasma and the ashing plasma are formed within a contiguous space of the processing chamber that is defined by sidewalls and top and bottom surfaces of the processing chamber, and that continuously extends along the sidewalls between the top and bottom surfaces of the processing chamber; and a substrate bias source configured to selectively apply a bias voltage to the semiconductor workpiece; and
a control unit configured to selectively operate a switching element to apply the bias voltage from the substrate bias source to the semiconductor workpiece when the first RF power source is operated to generate the etching plasma, and further configured to operate the switching element to disconnect the bias voltage from the semiconductor workpiece when the first RF power source is turned off and the second RF power source is operated to generate the ashing plasma.

18. The system of claim 17,
wherein the first RF power source is configured to provide a first RF signal having a first power; and
wherein the second RF power source is configured to provide a second RF signal having a second power that is less than the first power.

19. The system of claim 18,
wherein the first power is in a first range of between approximately 1000 watts (W) and approximately 2000 W; and
wherein the second power is in a second range of between approximately 50 W and approximately 200 W.

20. The system of claim 17, wherein the first plasma source comprises one of: a capacitive coupled plasma (CCP) source, an inductive coupled plasma (ICP) source or an electron cyclotron resonance (ECR) plasma source.

* * * * *